United States Patent
Van Ess

(10) Patent No.: US 8,352,527 B1
(45) Date of Patent: Jan. 8, 2013

(54) STATISTICAL METHOD FOR FILTER CONVERGENCE WITHOUT ACCUMULATING RESIDUAL ERROR

(75) Inventor: David Van Ess, Arlington, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1248 days.

(21) Appl. No.: 11/541,068

(22) Filed: Sep. 29, 2006

(51) Int. Cl.
*G06F 17/10* (2006.01)
(52) U.S. Cl. ............ 708/300; 708/6; 708/7; 708/306
(58) Field of Classification Search .............. None
See application file for complete search history.

(56) References Cited

U.S. PATENT DOCUMENTS

| 4,881,193 | A * | 11/1989 | Hamada et al. | 708/650 |
| 6,301,596 | B1 * | 10/2001 | Karanovic | 708/319 |
| 6,874,007 | B2 * | 3/2005 | Denk et al. | 708/550 |
| 2004/0210611 | A1 * | 10/2004 | Gradishar et al. | 708/271 |

* cited by examiner

*Primary Examiner* — Michael D Yaary

(57) ABSTRACT

Disclosed is a filter circuit, comprising a signal to be filtered, a difference circuit coupled to the signal to be filtered, a filter having an input coupled to the difference circuit, an integrator (or accumulator) having a first input coupled to an output of the filter circuit, and having a second input, and an accumulator coupled to an output of the integrator. A method of filtering is described also.

23 Claims, 7 Drawing Sheets

400

```
asl    [bRandomValue]   //update random number generator jnc    label0 xor    [bRandomValue],0x71 label0:

mov    [bVdiff],[bVin]   //Vdiff=Vin-Vout)

mov    A,[bVout]

sub    [bVdiff],A mov    A,0               //A holds the residue asr    [bVdiff]          //Vdiff = Vdiff/4 rrc    A asr    [bVdiff]

rrc    A add    A,[bRandom]       //Vout = Vout +Vdiff + weighted carry mov    A,[bVdiff]

adc    [bVout],A
```

STATISTICAL METHOD FOR FILTER CONVERGENCE WITHOUT ACCUMULATING RESIDUAL ERROR

TECHNICAL FIELD

The present invention relates generally to electronic circuits, and in particular to filter circuits and software.

BACKGROUND

A digital filter is any electronic filter that works by performing digital mathematical operations on an intermediate form of a signal. This is in contrast to analog filters which work entirely in the analog realm and must rely on physical networks of electronic components (such as resistors, capacitors, transistors, etc) to achieve the desired filtering effect.

Digital filters are very flexible and can achieve virtually any filtering effect that can be expressed as a mathematical function or algorithm. The two primary limitations of digital filters are speed (the filter can't operate any faster than the processor at the heart of the filter), and cost. However as the cost of integrated circuits continues to drop over time, digital filters have become increasingly commonplace and are now an essential element of many everyday objects such as radios, cellphones, and stereo receivers.

Digital filters may be implemented in programmable logic devices (PLDs) and programmable system on a chip devices (such the PSoC microcontroller, a trademark of Cypress Semiconductor Corp.). Digital filters may also be implemented in field programmable gate arrays (FPGAs), or in microprocessors (using either hardware or software implementations).

FIG. 1 shows a first conventional 1 pole filter circuit 100. The circuit 100 comprises an input voltage 110 (Vin) coupled to a difference function 120. The difference function 120 outputs a difference voltage 130 which is passed to a divider 140. The output of the divider 140 is coupled to a summing function 150, the output of which is coupled to accumulator 160. Accumulator 160 accumulates the difference value with the previous output voltage Vout. The accumulator 160 generates an output voltage 170 (Vout). The output voltage 170 is coupled back via a feedback path 180 to the summing function 150 and to the difference function 120.

FIG. 2 shows a second conventional n-bit filter circuit 200. The circuit 200 comprises an n-bit input voltage 210 (Vin) coupled to a difference function 220. The n-bit input is a digital word for example an 8-bit or 16-bit wide word, or any other width word. The difference function 220 outputs a difference voltage 230 which is passed to a divider 240. The output of the divider 240 is coupled to a summing function 250, the output of which is coupled to an accumulator function 260 which has an output voltage 270 (Vout). The output n-bit voltage 270 is coupled back via a feedback path 280 to the summing function 250 and to the difference function 220.

FIG. 3 shows a third conventional filter circuit 300. The circuit 300 comprises an n-bit input voltage 310 (Vin) coupled to a n-bit to m-bit converter 315. The m-bit output of the converter 315 is passed to a difference function 320. The difference function 320 outputs a m-bit difference voltage 330 which is passed to a divider 340. The m-bit output of the divider 340 is coupled to a summing function 350, the output of which is coupled to an accumulator 360 which has an m-bit output voltage 380 (Vout). The output n-bit voltage 180 is coupled back via a feedback path to the summing function 350 and to the difference function 320. The m-bit output voltage 380 is coupled to a m-bit to n-bit converter 365, which outputs an n-bit output voltage 370 (Vout).

Conventional filter solutions work well for analog (infinite resolution) implementations, because infinite resolution is available in its storage elements. but when the analog signals are digitized they now have a finite resolution. Any division of this value causes values less than the assigned quantization.

In a conventional filter, as the value of the divider gets greater, the residue (amount left over after a divide by operation) increases. For example in an operation to divide 15 by 4, the result is 3 (since 4*3=12, the biggest multiplicand of 4 less than 15) with a residue of 3 (15−12=3). In a divide by 4 operation, the residue can be 0, 1, 2, or 3. As a result, 2 bits of memory are required to represent the residue. Similarly, for a divide by 8 operation, 3 bits of memory are required to represent the residue. So as the divide value (and the filter resolution) grows, the memory required for the residue increases. In embedded systems where memory is at a premium, this can be a problem.

The residue is used to allow the filter to converge to an accurate representation of the analog value. By storing and summing the residues the quantization error can be accumulated and the filter can converge (reach the most accurate representation) of an analog value input. If due to memory limitations (for example in embedded devices where memory is scarce) the residue value is discarded, then the filter will never fully converge to the ideal value, i.e. the most accurate representation of the input. So to reach an accurate representation, extra (and often costly) memory may be required. Furthermore, if the divider value can change on the fly (during operation) then the conventional solution requires a memory large enough for use with the largest (worst case) divider.

BRIEF DESCRIPTION OF THE DRAWINGS

FIG. 4 illustrates exemplary code for implementing a filter convergence solution according to one embodiment of the present invention.

DETAILED DESCRIPTION

A statistical method for filter convergence without accumulating residual error is described. The described method only requires the storage and processing of "n" bits, where n is the quantization level. An M-bit divider comprises this N value plus some divide by value. In the conventional solution 'M−N' is a divide residue that has to be stored, but in one embodiment of the present invention, the 'M−N' does not have to be stored thus saving memory. In one embodiment of the present invention, a number generator is used to determine if the value resulting from the divide operation is rounded up or rounded down. The method and modules described herein may be implemented with software, hardware, firmware or a combination thereof.

FIG. 4 illustrates exemplary code 400 for implementing one embodiment of a filter convergence solution. The code 400 describes a method for filtering including determining a difference between an input signal and an output signal, storing a residue value, resetting an accumulator value, performing a divide operation on the difference to create a divided value, and accumulating the divided value and a statistically weighted carry of the residue value.

Figure 1:
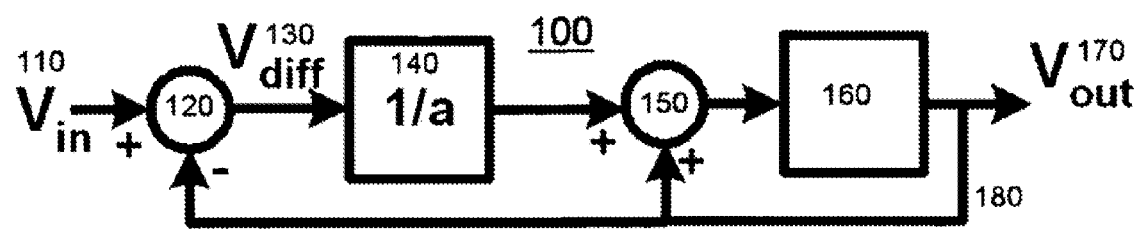
FIG. 1 illustrates a first conventional 1-bit filter solution.
Figure 2:
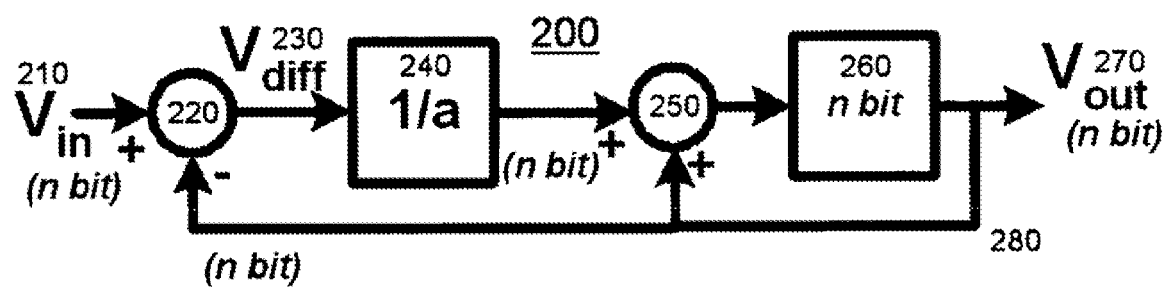
FIG. 2 illustrates a second conventional n-bit filter solution.
Figure 3:
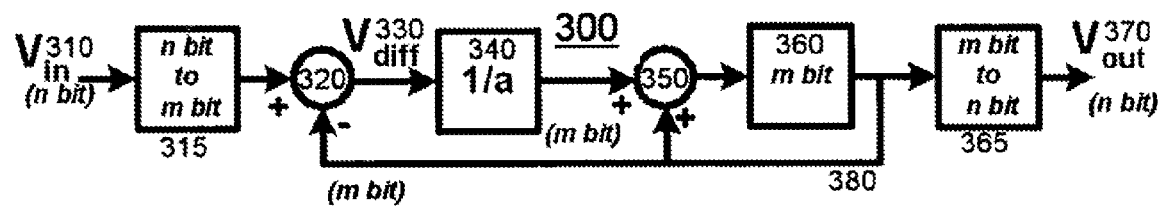
FIG. 3 illustrates a third conventional n-bit to m-bit filter solution.
Figure 5:
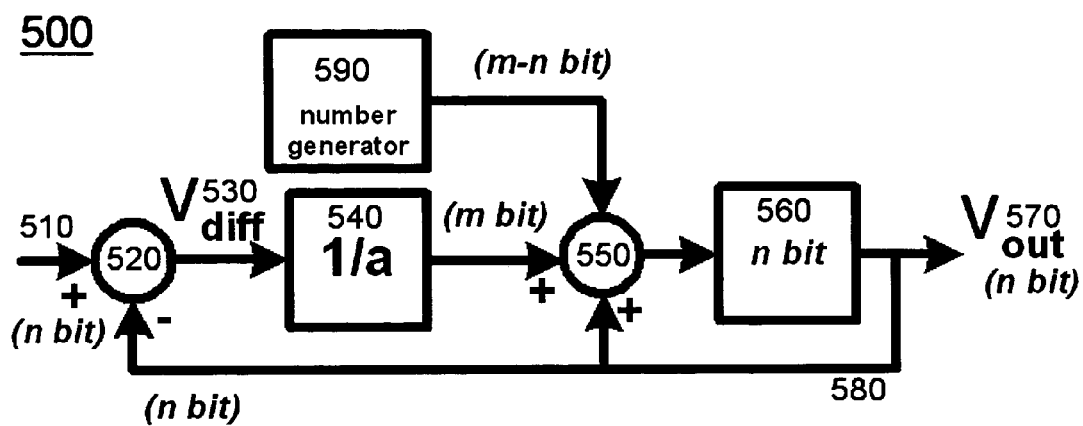
FIG. 5 illustrates a block diagram of a filter convergence solution according to one embodiment of the present invention.

FIG. 5 illustrates a block diagram of one embodiment of a filter convergence solution module 500. Filter convergence solution module 500 includes an n-bit input voltage 510 (Vin) coupled to a difference function module 520. The difference function module 520 outputs a difference voltage 530 which is passed to a filter divider 540. The output of the divider 540 is coupled to an integrator summing function module 550.

A number generator 590 provides a (m−n) bit value to the summing function module 550, where m is the bit width of the output of the divider block 540, and n is the bit width of the voltage input 510 and voltage output 570. In one embodiment, the number generator 590 is a pseudo-random number generator. The value from the number generator 590 to the summing function is shown as a m−n bit value. This value is added to the lower m bits of the divider 540 output. The upper n bits (output of the summing function module 550) are coupled to an accumulator register 560 which stores the n bit value, forming the memory part of the filter. Register 560 has an output n-bit voltage 580 which is coupled back via a feedback path to the summing function module 550 and to the difference function module 520.

The filter convergence solution module 500 operates by taking the highest potential value of residue from a divide operation and using it to determine the percentage chance that the result will be rounded up. In an exemplary embodiment, to determine the percentage chance that the result can be rounded up, in a divide by 4 operation the residue can be 0, 1, 2 or 3. Thus, for the highest potential value of residue (3 in this case) the percentage chance that the result will be rounded up is ¾=75% chance. Similarly, in a divide by 8 operation, the residue can be 0, 1, 2, 3, 4, 5, 6, or 7. Thus, for the highest potential value of residue (7 in this case) the percentage chance that the result will be rounded up is 7/8=87.5% chance.

In an example using numbers, if the difference is for example 27 and if the divisor is 4, the result is (27/4)=6.75. A random value between 0 and 1 is added to this value (from the number generator). There is a 75% chance that the result value is rounded up to 7 and a 25% chance it remains 6. On the average it is 6.75, since 75% of the time the answer is 7, and 25% of the time the answer is 6, so the average is the weighted sum of the answer and probability i.e. 0.75*7+−0.25*6=6.75.

The filter convergence solution module 500 uses a number generator which appears to be random with respect to the input data. This number generator may be a pseudo random number generator (such as a linear feedback shift register), or a counter or register or combination of registers infinite impulse response or any other signal source that appears to be random with respect to the input signal. The filter convergence solution module 500 uses one number generator, independent of the number of filters to be implemented. In other embodiments, more than one number generator could be used also. For example combinations of number generator methods could be used to provide data that is random with respect to the input data.

Figure 6:
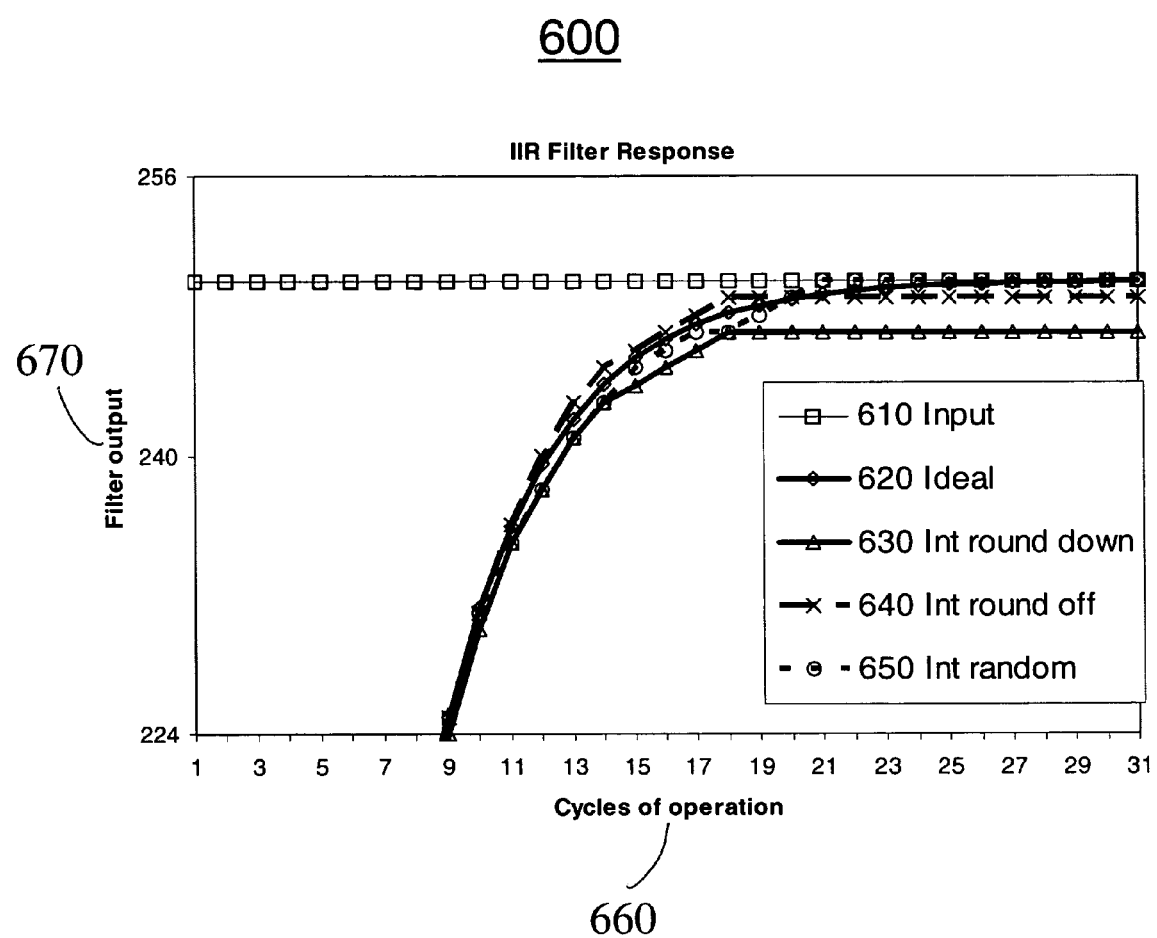
FIG. 6 illustrates the response of an IIR filter using the filter convergence solution embodiment of FIG. 5.

FIG. 6 shows the waveform response 600 of an infinite impulse response (IIR) filter using the filter convergence solution module 500. Infinite impulse response is a property of signal processing systems, and filters with that property are known as IIR filters. These finite impulse response (IIR) filters have an impulse response function which is non-zero over an infinite length of time. This is in contrast to finite impulse response filters (FIR) which have fixed-duration impulse responses. The simplest analog IIR filter is a resistor-capacitor (RC) filter made up of a single resistor (R) feeding into a node shared with a single capacitor (C). This filter has an exponential impulse response characterized by an RC time constant.

Recursive filters are signal processing filters which re-use one or more output(s) of the filter as inputs. This feedback results in an unending impulse response characterized by either exponentially growing, decaying, or sinusoidal signal output components. IIR filters may be implemented as either analog or digital filters. In digital IIR filters, the output feedback is immediately apparent in the equations defining the output. Note that unlike with FIR filters, in designing IIR filters it is necessary to carefully consider "time zero" case in which the outputs of the filter have not yet been clearly defined.

In FIG. 6, the x-axis 660 shows the cycles of operation (from when the filter started up) and the y-axis 670 shows the count to which the filter is converging. The waveform 600 shows the input 610, the ideal output 620, the output for integer rounded down 630, the output for integer round off 640 (integer round off means that integer is rounded up or down based upon an algorithm) and the output 650 for integer plus a random value. This waveform 600 shows that the integer plus random value 650 converges correctly with the input value.

Figure 7:
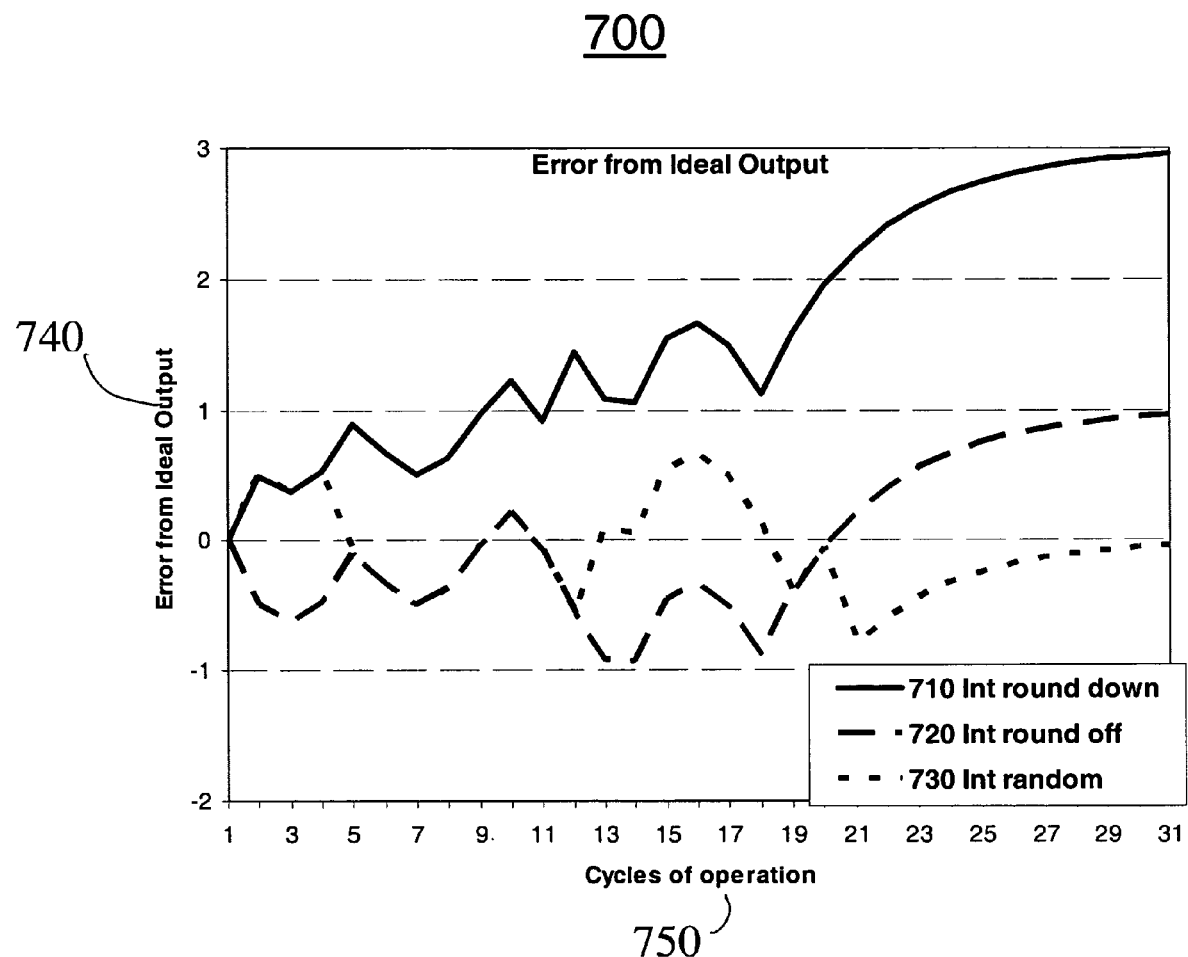
FIG. 7 illustrates the error from ideal output of an IIR filter using the filter convergence solution embodiment of FIG. 5.

FIG. 7 shows waveform 700 illustrating the error from the ideal output of an IIR filter using the filter convergence solution module 500. The x-axis 740 shows the cycles of operation (from when the filter started up) and the y-axis 750 shows the error from ideal output of the improved filter convergence solution. Wave 710 shows the output for integer rounded down, 720 shows the result for integer rounded off, and 730 shows the result for integer plus a random value. This waveform shows that the result for output 730 integer plus a random value converges with zero input error, i.e. converges to the ideal value.

Advantages of the filter convergence solution module 500 include that it is easy to implement, and this technique works independent of the value of "a", the attenuation or divide by value.

In an alternative embodiment, a multiple pole filter could be used instead of a single pole filter to achieve similar results. Furthermore, the filter convergence solution module 500 is applicable to any application with iterative calculations where there is a residue that needs to be stored.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A filter apparatus, comprising:
   a difference circuit coupled to receive an input signal to be filtered;
   a divider having an input coupled to an output of the difference circuit;
   a summing function module having a first input coupled to an output of the divider, and having a second input;
   a number generator coupled with the second input, wherein the number generator is configured to generate a value according to a probability determined by dividing a residue value resulting from a divide operation performed by the divider by a highest potential value of the residue; and
   an accumulator register coupled to an output of the summing function module.

2. The apparatus of claim 1, wherein the second input is uncorrelated with the input signal to be filtered.

3. The apparatus of claim 1, wherein the number generator is a pseudo random number generator.

4. The apparatus of claim 3, further comprising a feedback path between the accumulator and the difference circuit.

5. The apparatus of claim 4, further comprising a residue value determined by a difference between an input value and a feedback value.

6. The apparatus of claim 3 wherein the output of the divider has a first bit width and the input signal and feedback path have a second bit width.

7. A method of filtering, comprising:
   determining a first difference value;
   filtering the first difference value to provide a filtered output and a residue value resulting from a divide operation;
   generating a second value according to a probability determined by dividing the residue value by a highest potential value of the residue;
   integrating the filtered output and the second value to generate an integrated value; and
   accumulating the integrated value and providing an accumulated output value.

8. The method of claim 7, further comprising resetting the accumulated output value.

9. The method of claim 8, further comprising feeding back the accumulated output value to a difference function and to an integrator function.

10. The method of claim 9 wherein the difference function determines a first difference value, and wherein the integrator function is configured to integrate the filtered output and the second value.

11. The method of claim 7 wherein the filtering comprises providing a filtered output having a bit width different from the width of an input to the filter.

12. The method of claim 9, wherein the step of feeding back the accumulated output value comprises outputting an accumulated output having a bit width different to that of the integrated value.

13. The method of claim 10 wherein the second value is uncorrelated with the first difference value.

14. The method of claim 10 wherein the second value is a pseudo random number.

15. A method of filtering, comprising:
    determining a difference between an input signal and an output signal;
    performing a divide operation on the difference to create a divided value and a residue of the divide operation of;
    generating a weighted round up for the divided value, wherein a probability of the weighted round up is determined by dividing the residue by a highest potential value of the residue; and
    updating an accumulator with the divided value.

16. The method of claim 15, wherein the step of generating a weighted round up takes as inputs the residue and value that appears random relative to the input signal.

17. The method of claim 16, wherein the step of generating a weighted round up takes as inputs the residue and a pseudo-random value.

18. The method of claim 15 wherein the step of dividing comprises providing a divided output having a bit width different from the width of input to the divider.

19. The method of claim 13, wherein the step of updating the accumulator comprises outputting an accumulated output having a bit width different to that of the divided value.

20. A system, comprising:
    means for determining a first difference value;
    means for filtering the first difference value to provide a filtered output and a residue value resulting from a divide operation;
    means for generating a second value according to a probability determined by dividing the residue value by a highest potential value of the residue;
    means for integrating the filtered output and the second value; and
    means for accumulating the integrated value and providing an accumulated output value.

21. The system of claim 20, further comprising means for resetting the accumulated output value.

22. The system of claim 21, further comprising means for passing the accumulated output value to a difference function and to an integrator function.

23. The system of claim 22 wherein the difference function determines a first difference value, and wherein the integrator function is configured to integrate the filtered output and the second value.

* * * * *